(12) United States Patent
Zhong et al.

(10) Patent No.: US 9,954,074 B2
(45) Date of Patent: Apr. 24, 2018

(54) INSULATED GATE BIPOLAR TRANSISTOR AND MANUFACTURING METHOD THEREFOR

(71) Applicant: CSMC TECHNOLOGIES FAB1 CO., LTD., Wuxi New District (CN)

(72) Inventors: Shengrong Zhong, Wuxi New District (CN); Xiaoshe Deng, Wuxi New District (CN); Genyi Wang, Wuxi New District (CN); Dongfei Zhou, Wuxi New District (CN)

(73) Assignee: CSMC TECHNOLOGIES FAB1 CO., LTD., Wuxi New District (CN)

( * ) Notice: Subject to any disclaimer, the term of this patent is extended or adjusted under 35 U.S.C. 154(b) by 0 days.

(21) Appl. No.: 14/902,517

(22) PCT Filed: Jul. 22, 2014

(86) PCT No.: PCT/CN2014/082730
§ 371 (c)(1),
(2) Date: Dec. 31, 2015

(87) PCT Pub. No.: WO2015/010606
PCT Pub. Date: Jan. 29, 2015

(65) Prior Publication Data
US 2016/0380072 A1 Dec. 29, 2016

(30) Foreign Application Priority Data
Jul. 22, 2013 (CN) .......................... 2013 1 0306819

(51) Int. Cl.
*H01L 29/66* (2006.01)
*H01L 29/40* (2006.01)
(Continued)

(52) U.S. Cl.
CPC .. *H01L 29/66333* (2013.01); *H01L 21/02233* (2013.01); *H01L 21/26513* (2013.01);
(Continued)

(58) Field of Classification Search
CPC ............. H01L 29/7393; H01L 29/7394; H01L 29/7395; H01L 29/7396; H01L 29/7397; H01L 29/7398
See application file for complete search history.

(56) References Cited

U.S. PATENT DOCUMENTS

2006/0038206 A1* 2/2006 Shimoyama ........ H01L 21/6835
257/273
2006/0049434 A1* 3/2006 Takei .................. H01L 29/0649
257/273
(Continued)

FOREIGN PATENT DOCUMENTS

CN     1328345     12/2001
CN     101345254   1/2009
(Continued)

OTHER PUBLICATIONS

Deng et al., U.S. Appl. No. 14/902,516, filed Jul. 29, 2014.
(Continued)

*Primary Examiner* — Michael Carter
*Assistant Examiner* — Mohammed R Alam
(74) *Attorney, Agent, or Firm* — Kagan Binder, PLLC

(57) ABSTRACT

An insulated gate bipolar transistor and a manufacturing method therefor. The insulated gate bipolar transistor comprises a semiconductor substrate (1) of a first conductive type, which is provided with a first major surface (1S1) and a second major surface (1S2), wherein the semiconductor substrate (1) comprises a primitive cell area (2) and a terminal protection area (4) which is located outside the primitive cell area; a first semiconductor layer (5) of a first
(Continued)

conductive type which is formed at the side of the first major surface of the semiconductor substrate (1), wherein the doping concentration of the first semiconductor layer (5) is higher than the doping concentration of the semiconductor substrate (1); and an insulated gate transistor unit which is formed at the side of the first major surface of the first semiconductor layer (5) in the primitive cell area, wherein the insulated gate transistor unit is conducted, a channel of a first conductive type is formed. Compared with the prior art, the present invention not only can improve the voltage resistance reliability of the insulted gate bipolar transistor, but also can reduce the forward conductive voltage drop of the insulated gate bipolar transistor.

7 Claims, 7 Drawing Sheets

(51) Int. Cl.
| | | |
|---|---|---|
| *H01L 29/739* | (2006.01) | |
| *H01L 29/06* | (2006.01) | |
| *H01L 29/10* | (2006.01) | |
| *H01L 21/02* | (2006.01) | |
| *H01L 21/265* | (2006.01) | |

(52) U.S. Cl.
CPC ...... *H01L 29/0619* (2013.01); *H01L 29/1095* (2013.01); *H01L 29/402* (2013.01); *H01L 29/404* (2013.01); *H01L 29/7395* (2013.01)

(56) References Cited

U.S. PATENT DOCUMENTS

| | | | | |
|---|---|---|---|---|
| 2011/0233714 | A1* | 9/2011 | Lu | H01L 29/66348 257/493 |
| 2013/0134478 | A1* | 5/2013 | Nakajima | H01L 29/66333 257/139 |
| 2013/0264674 | A1* | 10/2013 | Mizushima | H01L 29/0619 257/487 |
| 2015/0014742 | A1* | 1/2015 | Lu | H01L 29/7393 257/139 |

FOREIGN PATENT DOCUMENTS

| | | |
|---|---|---|
| WO | 2015/014263 | 2/2015 |
| WO | 2015/024502 | 2/2015 |
| WO | 2015/027961 | 3/2015 |
| WO | 2015/081866 | 6/2015 |
| WO | 2015/103910 | 7/2015 |

OTHER PUBLICATIONS

Zhang et al., U.S. Appl. No. 14/902,519, filed Aug. 19, 2014.
Wang et al., U.S. Appl. No. 14/902,302, filed Sep. 2, 2014.
Zhang et al., U.S. Appl. No. 15/023,049, filed Dec. 3, 2014.
Jing, U.S. Appl. No. 15/023,057, filed Dec. 4, 2014.
English Translation of PCT Search Report for International Application No. PCT/CN2014/082730; dated Sep. 26, 2014.

* cited by examiner

INSULATED GATE BIPOLAR TRANSISTOR AND MANUFACTURING METHOD THEREFOR

FIELD OF THE INVENTION

The invention relates to a field of semiconductor design and manufacture, and more particularly, relates to an Insulated Gate Bipolar Transistor (IGBT, in short) and a manufacturing method of the IGBT.

BACKGROUND OF THE INVENTION

IGBT is an integrated full controllable driving power semiconductor device which is consisted of BJT (Bipolar Junction Transistor) and MOSFET (Metal-Oxide-Semiconductor-Field-Effect-Transistor). The IGBT possesses advantages of two aspects: high input impedance introduced by MOSFET and low drop voltage introduced by BJT. The IGBT, which has such characteristics as: a high working frequency, a simple control circuit, a high current density, and a low conducting voltage, is extensively applied to the power control field.

It is generally required to solve the following technical problems of IGBTs: first, under a high temperature, a leak current of the IGBT is slightly larger, or even continuously increases and cannot remain stable, when returning to a normal temperature, the breakdown voltage of which is reduced or even a short circuit emerges (i.e. the voltage withstanding reliability problem of the IGBT); for the second problem, in order to improve the performance of the IGBT as far as possible, it requires continuously decreasing the on-resistance of the IGBT. Taking a high voltage IGBT for example, the main factors influencing the forward conductive voltage drop Vce(on) are the JEFT (Junction Field Effect Transistor) region equivalent resistance RJ and the drift region equivalent resistance RD. Therefore, the main factor to be considered in designing a high power IGBT is to reduce the two resistances as far as possible.

For the first technical problems,

It is generally acknowledged that the problem is mainly caused by mobile charge in the interior of the device and also by externally introduced mobile charge. In a practical case, the mobile charge moves under external stress, and leads to a change of the stable original surface field, causing the withstanding voltage to be changed, or even causing the leak current to be increasing. In order to quantitative express the influence to the terminal surface field caused by the external charge, the influence factor is defined as:

$$\alpha = \Delta Q/(\Delta Q + Q_f) \quad (1)$$

wherein $\Delta Q$ indicates the effective mobile charges, $Q_f$ indicates the surface charges of the substrate. $\alpha$ indicates that when the influence of the mobile charges is greater, the voltage withstanding reliability of the device is worse, vice versa.

The technical method to solve the problems mainly starts from two aspects, on one aspect, reducing the factors which introduce mobile charges in the chip manufacturing and package process as far as possible, such as adopting a special surface passivation technology or adopting a high reliability synthetic resin to perform a package process, to reduce an introduction of external charges and water vapor and so on, it possesses an notable progress to reduce the leak current of the device under a high temperature. However, the method requires a high level package technology and the technological cost is relatively high. On the other aspect, adopting a special designed structure to strengthen a shielding effect of the chip to the mobile charges, thereby improving an electric leakage performance of the device under a stress condition with a high temperature and a high voltage, such as adopting a SIPOS (Semi-Insulating Polycrystalline silicon) structure which connects an end of the semi-insulating thin-film resistance to the main wiring, another end connects the cut-off ring, under a high reversed biasing condition, opposite ends of the semi-insulating resistance will generate an electric field, the electric field can shield an influence to the terminal surface electric field caused by the mobile charges, thereby improving a breakdown performance of the device after a test under a high temperature and a high voltage condition. The semi-insulating thin-film is generally formed by performing an oxygen doping or a nitrogen doping to polycrystalline silicon, and the specific resistance is required to fall into a range of $10^7$ to $10^{10}$. Therefore, when adopting the SIPOS structure, the technical process is complex, and the quality of the thin-film resistance requires an accuracy control according to a design. The structure adopts the semi-insulating resistance to directly bridge the high voltage and the ground which can generate a non-ignorable power consumption when under an normal operation condition. At the same time, the thin-film resistance has a relative high temperature coefficient, and there is a stability problem to a certain extent.

For the second technical problem:

In order to reduce the forward conductive voltage drop of the device, the prior art mainly starts from reducing JEFT region equivalent resistance RJ and the drift region equivalent resistance RD.

For JEFT region equivalent resistance RJ, there are three kinds of solutions at present: first, a concentration of the carriers on the JEFT region is increased, and the JEFT resistance is reduced, but the method requires adding technical processes and the effect thereof is not obvious; second, the channel gate is adopted to substitute the planar gate, and the JEFT region in the planar gate is removed, the method directly removes the JEFT resistance, and the current density of the device is effectively increased, and the method is extensively applied to the low voltage IGBT, but the manufacture process of the method is complex, and the morphology of channel gate and the technical control influence the reliability of the IGBT greatly, it is seldom applied to a high voltage IGBT; third, a carrier storage layer is additionally provided under the P-body region, to increase a concentration of the carriers and reduce a forward conductive voltage drop, but the method requires adding technical processes, and the effect thereof is not obvious; fourth, the JEFT resistance is reduced by virtue of increasing a size of the planar gate, but the method will reduce a current density and a breakdown voltage of the device, and it requires an optimization design.

For the drift region resistance RD, it is achieved mainly by reducing a thickness of the drift region. Up to now, there are mainly three kinds of structures: punch-through IGBT (PT-IGBT), non-punch though IGBT (NPT-IGBT), and field-stop IGBT (FS-IGBT). The main differences among the three structures are the different structures of the substrate PN junctions and the different thicknesses of the drift regions. Compared with the PT-IGBT and the NPT-IGBT, the FS-IGBT has the thinnest thickness, and the forward conductive voltage drop decreases obviously, and the structure is extensively applied to the IGBT product. However, as the continuous increase of the sizes of the semiconductor wafers, the cost of grinding equipments, process complexity and high debris rate severely limit continuous improvements of the performances of IGBT.

Therefore, it is necessary to provide an improved technical solution to solve such problems.

SUMMARY OF THE INVENTION

Therefore, it is necessary to provide an IGBT and an IGBT manufacturing method thereof, which not only can improve a voltage withstanding reliability of the IGBT, but also can reduce a forward conductive voltage drop of the IGBT.

An IGBT includes: a semiconductor substrate with a first conductivity type and having a first major surface and a second major surface, wherein the semiconductor substrate has a primitive cell region and a terminal protection region located outside the primitive cell region; a first semiconductor layer with the first conductivity type and formed on the first major surface of the semiconductor substrate, wherein a doping concentration of the first semiconductor is greater than a doping concentration of the semiconductor substrate; and an IGBT unit formed on the first major surface of the first semiconductor layer and within the primitive cell region, wherein the IGBT unit forms a channel with the first conductivity type when the IGBT unit is conducting.

According to one embodiment, the IGBT further includes a protection terminal formed on the first major surface of the first semiconductor layer and within the terminal protection region.

According to one embodiment, the IGBT further includes: a second semiconductor layer with a second conductivity type formed on the second major surface of the semiconductor substrate; a first main electrode formed on the first major surface of the first semiconductor layer where the IGBT unit is formed; and a second main electrode formed on the second semiconductor layer.

According to one embodiment, the first conductivity type is N-type, and the second conductivity type is P-type, the IGBT unit is an N-channel MOSFET unit, the semiconductor substrate with the first conductivity type is an N-type semiconductor substrate, the first semiconductor layer is N+ type semiconductor layer, the second semiconductor layer is P+ type collector layer, the first main electrode is an emitter, the second main electrode is a collector.

According to one embodiment, the N-channel MOSFET unit includes: a P-body region selectively formed from the first major surface of the N+ type semiconductor layer in the primitive cell region to an interior of the N+ type semiconductor layer; an N+ active region selectively formed from the surface of the P-body region to an interior of the P-body region; a P+ active region selectively formed from a surface of the P-body region in the N+ active region to an interior of the P-body region; a gate oxide layer formed on the first major surface of a margin portion of the P-body region and the first major surface of N+ type semiconductor layer in the primitive cell region where the P-body region does not form; a polycrystalline silicon gate electrode formed on an upper surface of the gate oxide layer; a dielectric layer covering the gate oxide layer and an exposing surface of the polycrystalline silicon gate electrode; wherein the first main electrode is formed outside the dielectric layer and electrically connects to the N+ active region and the P+ active region.

According to one embodiment, the protection terminal includes a P-type field limiting ring region formed on the first major surface of the first semiconductor layer in the terminal protection region, and a metal field plate positioned above the P-type field limiting ring region and in electrical contact with the P-type field limiting ring region.

A method of manufacturing an IGBT, includes the following steps: manufacturing a semiconductor substrate with a first conductivity type and having a first major surface and a second major surface, wherein the semiconductor substrate includes a primitive cell region and a terminal protection region located outside the primitive cell region; forming a first semiconductor layer with the first conductivity type on the first major surface of the semiconductor substrate, wherein a doping concentration of the first semiconductor layer is greater than a doping concentration of the semiconductor substrate; and forming an IGBT unit on the first major surface of the first semiconductor layer and within the primitive cell region, wherein when the IGBT unit is conducting, it forms a channel with the first conductivity type.

According to one embodiment, the IGBT further includes: forming a protection terminal on the first major surface of the first semiconductor layer and within the terminal protection region.

According to one embodiment, the IGBT further includes: forming a first main electrode on the first major surface of the first semiconductor layer on which the IGBT unit is formed; grinding the IGBT unit from the second major surface of the semiconductor substrate to form a semiconductor substrate; forming a second semiconductor layer with the second conductivity type from the second major surface of the ground semiconductor substrate to an interior of the semiconductor substrate; and forming a second main electrode in electrical contact with the second semiconductor layer on the second semiconductor substrate.

According to one embodiment, the first conductivity type is N-type, and the second conductivity type is P-type, the IGBT unit is an N-channel MOSFET unit, the semiconductor substrate with the first conductivity type is an N− type semiconductor type substrate, the first semiconductor layer is N+ type semiconductor layer, the second semiconductor layer is P+ type collector layer, the first main electrode is an emitter, the second main electrode is a collector.

According to one embodiment, the step of forming the N+ type semiconductor layer includes: forming a pre-oxidization layer on the first major surface of the N− type semiconductor substrate; forming an N+ layer by performing an N-type impurity implantation on the first major surface of the N− type semiconductor layer 1 after penetrating through the pre-oxidization layer; and forming the N+ type semiconductor layer by a high temperature drive-in.

According to one embodiment, a thickness of the pre-oxidization layer is 1000 angstrom to 3000 angstrom, an implantation dose of the N-type impurity is 2e11 $cm^{-2}$ to 1e13 $cm^{-2}$, and energy thereof is 60 KEV to 120 KEV.

According to one embodiment, the protection terminal includes a P-type field limiting ring region formed on the first major surface of the first semiconductor layer and in the terminal protection region, and a metal field plate positioned above the P-type field limiting ring region and in electrical contact with the P-type field limiting ring region; the N-channel MOSFET unit includes: a P-body region selectively formed from the first major surface of the N+ type semiconductor layer and in the primitive cell region to an interior of the N+ type semiconductor layer; an N+ active region selectively formed from the P-body region to an interior of the P-body region; a P+ active region selectively formed from a surface of the P-body region in the N+ active region to an interior of the P-body region; a gate oxide layer formed on the first major surface of a margin portion of the P-body region and the first major surface of N+ type semiconductor layer and in the primitive cell region and does not form the P-body region; a polycrystalline silicon gate electrode formed on an upper surface of the gate oxide layer: a dielectric layer covering the gate oxide layer and an exposing surface of the polycrystalline silicon gate electrode; wherein the first main electrode is formed outside the dielectric layer and electrically connects the N+ active region and the P+ active region.

Comparing to the prior art, in above described IGBT and the manufacturing method of the IGBT, the first semiconductor layer with the first conductivity type is formed on the first major surface of the semiconductor substrate with the first conductivity type, and a doping concentration of the first semiconductor layer is greater than a doping concentration of the semiconductor substrate, the IGBT unit and the protection terminal is formed on the first major surface of the first semiconductor layer. Therefore, the first semiconductor layer functions as a carrier storage layer in the primitive cell region, thus leading to a reduce of a forward conductive voltage drop of the IGBT according to the invention, and simultaneously increasing a concentration of impurity of the surface of the protection terminal, reducing an influence to the surface electric field of the protection terminal caused by the mobile charges, and thereby enhancing a voltage withstanding reliability of the IBGT according to the invention.

BRIEF DESCRIPTION OF THE DRAWINGS

To illustrate the technical solutions according to the embodiments of the present invention or in the prior art more clearly, the accompanying drawing for describing the embodiments or the prior art are introduced briefly in the following. Apparently, the accompanying drawings in the following description are only some embodiments of the present invention, and persons of ordinary skill in the art can derive other drawings from the accompanying drawing without creative efforts.

DETAILED DESCRIPTION OF THE EMBODIMENTS

The above objects, features and advantages of the present invention will become more apparent by describing in detail embodiments thereof with reference to the accompanying drawings.

Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment.

Figure 1:
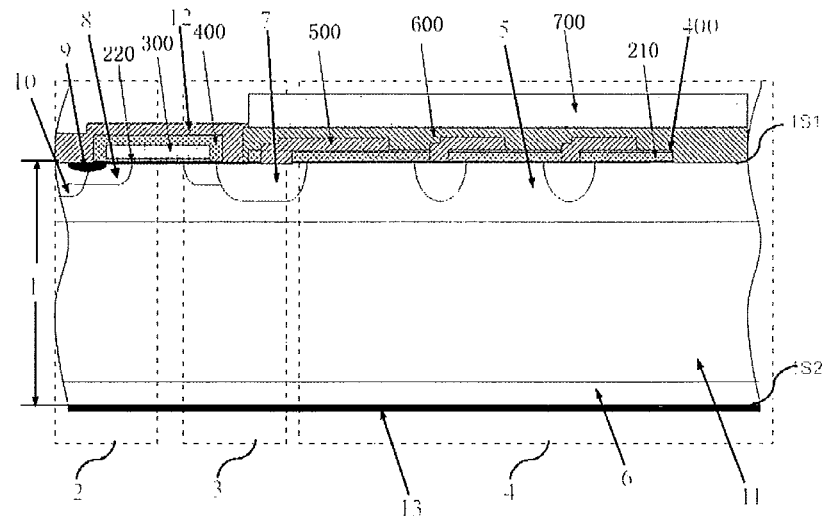
FIG. 1 is a longitudinal, sectional view of a portion of an IGBT according to one embodiment.

Referred to FIG. 1, which is a longitudinal, sectional view of a portion of an IGBT according to one embodiment, the IGBT includes: a semiconductor substrate 1 with a first conductivity type and having a first major surface 1S1 and a second major surface 1S2, which includes a primitive cell region 2, a terminal protection region 4 located outside the primitive cell region 2, and a transition region 3 between the primitive cell region 2 and the terminal protection region 4;

a first semiconductor layer 5 with the first conductivity type and formed on the first major surface 1S1 of the semiconductor substrate 1, a doping concentration of the first semiconductor 5 is greater than a doping concentration of the semiconductor substrate 1; an IGBT unit formed on the first major surface 1S1 of the first semiconductor layer 5 and within the primitive cell region 2, which forms a channel with the first conductivity type when the IGBT unit is conducting; a protection terminal formed on the first major surface 1S1 of the first semiconductor layer 5 and within the terminal protection region 4; and a second semiconductor layer 6 with a second conductivity type formed on the second major surface 1S2 of the semiconductor substrate 1.

The IGBT further includes a first main electrode 12 formed on the first major surface 1S1 of the first semiconductor layer 5 where the IGBT unit is formed; and a second main electrode 13 formed on the second semiconductor layer 6.

The following takes N-type as the first conductivity type, and takes P-type as the second conductivity type, for example, and the structure of the IGBT according to the invention is specifically illustrated with reference to FIG. 1, herein after.

In the embodiment shown in FIG. 1, the semiconductor substrate 1 with the first conductivity type is an N– type semiconductor type substrate (also known as N– layer). The first semiconductor layer 5 with the first conductivity type formed on the first major surface 1S1 of the semiconductor substrate 1 is N+ type semiconductor layer (or called Face N+ layer). The protection terminal is a field limiting ring in combination with a field plate terminal structure, which includes a P-type field limiting ring region 7 (or called field limiting ring structure) formed by performing P-type impurity selectively doping from the first major surface 1S1 of the terminal protection region 4 to the N+ type semiconductor layer 5, and a metal field plate 500 positioned above the P-type field limiting ring region and in electrical contact with the P-type field limiting ring region. The protection terminal further includes a field oxide layer 210 formed on the first major surface of the margin portion of the P-type field limiting ring region 7 and the first major surface of the terminal protection region 4 which does not form the P-type field limiting ring region 7, and a dielectric layer 400 formed on a surface of the field oxide layer 210. It is readily envisaged that the protection terminal can also be other protection terminal structure in the prior art, such as the field limiting ring terminal structure.

The IGBT unit is a MOSFET with the first conductivity type channel (here as an N-channel). Specifically, the MOSFET with the N-channel is a MOSFET with a DMOS (Double-diffused Metal Oxide Semiconductor) structure. The MOSFET includes a P-body region 8 (or called P base region) formed by selectively diffusing a P-type impurity from the first major surface 1S1 of the primitive cell region 2 into the N+ type semiconductor layer 5; an N+ active region 9 (or called N+ emitter region) formed by selectively diffusing a high concentration N-type impurity from the surface of the P-body region 8 to the interior of the P-body region 8; a P+ active region 10 formed by diffusing a high concentration P-type impurity from the surface of the P-body region 8 in the N+ active region 9 to the interior of the P-body region 8; a gate oxide layer 220 formed on the first major surface of the margin portion of the P-body region 8 and the first major surface of the primitive cell region 2 where the P-body region 8 does not form; a polycrystalline silicon gate electrode 300 formed on an upper surface of the gate oxide layer 220; a dielectric layer 400 covering the gate oxide layer 220 and an exposing surface of the polycrystalline silicon gate electrode 300, the portion of the P-body region 8 underneath the polycrystalline silicon gate electrode 300 is called the channel region.

In the embodiment shown in FIG. 1, the second semiconductor layer 6 with the second conductivity layer is a P+ layer (or called P+ collector layer) formed by a P-type impurity implanting from the second major surface 1S2 into the N− type semiconductor layer 1. The portion of the N− type semiconductor substrate 1 between the P+ collector layer 6 and N+ semiconductor layer 5 is an N− type drift region 11.

The IGBT shown in FIG. 1 further includes a first main electrode 12 (an emitter in the embodiment) on the first major surface 1S1 of the primitive cell region 2 and covering the dielectric layer 400, the first main electrode in electrical contact with the N+ active region 9 and the P+ active region 10; a second main electrode 13 (in the embodiment, it is a collector) formed on the second semiconductor layer 6, the second main electrode 13 in electrical contact with the second semiconductor layer 6; and a first passivation layer 600 and a second passivation layer 700 configured to protect the chip surface from being contaminated by external ions, covering the first main electrode 8, the field oxide layer 400, and the metal field plate 500. In the context, among N−, N+, P+, "+" indicates a higher doping concentration, "−" indicates a lower doping concentration.

Comparing to the prior art, in the IGBT according to the invention shown in FIG. 1 the N+ type semiconductor layer 5 forms on the first major surface 1S1 of the N− type semiconductor 1. Because the doping concentration of the N+ type semiconductor layer 5 is greater than the doping concentration of the semiconductor substrate 1, and the IGBT unit is formed originally from the N+ type semiconductor layer 5, therefore, the N+ type semiconductor layer 5 functions as a carrier storage layer in the primitive cell region 2. When the IGBT in FIG. 1 is forwardly conducting, cavities implanted into the N− type drift region 11 from the P+ collector layer 6 of the second major surface 1S2 are blocked by potential barrier formed by the N+ type semiconductor layer 5 when the cavities are diffused, which causes a few carrier cavities to be accumulated adjacent to a place beneath the interface between the P-body region 8 and the N+ type semiconductor layer 5, according to the electro-neutrality principle, the concentration of the carriers on the region is greatly increased, thereby reducing a forward conductive voltage drop of the IGBT according to the invention. In addition, because the doping concentration of the N+ type semiconductor layer 5 is greater than the doping concentration of the semiconductor substrate 1, and the protection terminal is formed based upon the N+ type semiconductor layer 5, so that the concentration of the impurity on the surface of the protection terminal is increased (i.e. the charges $Q_f$ on the surface of the protection terminal is increased, referring to the formula (1) in the background), thereby reducing an influence to the surface electric field of the protection terminal caused by the mobile charges, and further enhancing a voltage withstanding reliability of the device.

In the embodiment shown in FIG. 1, the IGBT unit is a MOSFET having a DMOS structure. In alternative embodiments, it can also be a trench type MOSFET or a V-shaped MOSFET.

Figure 13:
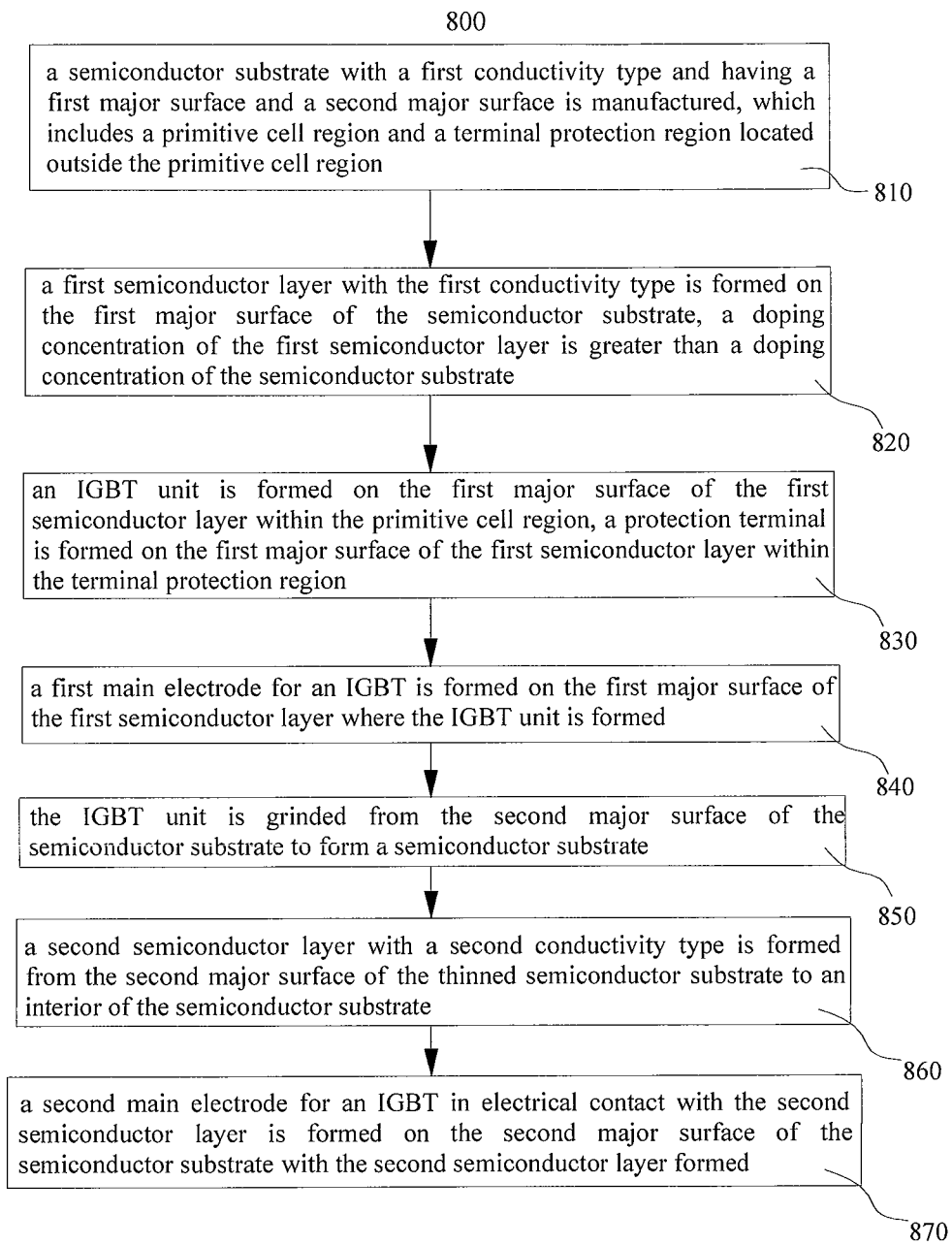
FIG. 13 is a flow chart of a method of manufacturing the IGBT of FIG. 1 according one embodiment.

FIG. 13 is a flow chart of a manufacturing method 800 of the IGBT of FIG. 1 according one embodiment. With reference to FIG. 1 and FIG. 13, the manufacturing method 800 includes the following steps:

In step 810, a semiconductor substrate 1 with the first conductivity type, which has a first major surface 1S1 and a second major surface 1S2, is manufactured, the semiconductor substrate 1 includes a primitive cell region 2 and a terminal protection region 4 located outside the primitive cell region 2.

In step 820, a first semiconductor layer 5 with the first conductivity type is formed on the first major surface 1S1 of the semiconductor substrate 1, a doping concentration of the first semiconductor layer 5 is greater than a doping concentration of the semiconductor substrate 1.

In step 830, a protection terminal is formed on the first major surface 1S1 of the first semiconductor layer 5 and within the terminal protection region 4, an IGBT unit is formed on the first major surface 1S1 of the first semiconductor layer 5 and within the primitive cell region 2.

In step 840, a first main electrode 12 is formed on the first major surface 1S1 of the primitive cell region 2 where the IGBT forms.

In step 850, the IGBT unit is grinded from the second major surface of the semiconductor substrate 1 to form a semiconductor substrate 1, and the ground semiconductor substrate 1 is allowed to meet a prescribed thickness requirement.

In step 860, a second semiconductor layer 6 with the second conductivity type is formed from the second major surface 1 S2 of the ground semiconductor substrate 1 to an interior of the semiconductor substrate 1.

In step 870, a second main electrode 13 in electrical contact with the second semiconductor layer 6 is formed on the second major surface 1S2 of the semiconductor substrate 1 with the second semiconductor layer 6 formed.

Next, taking the N-type as the first conductivity type, and taking the P-type as the second conductivity type, for example, the manufacturing method of the IGBT of FIG. 1 according to one specific embodiment is illustrated with reference to FIGS. 2-12. The manufacturing method includes the following steps:

In step one, an N− type semiconductor substrate 1 having a first major surface 1S1 and a second major surface 1 S2 is manufactured.

Figure 2:
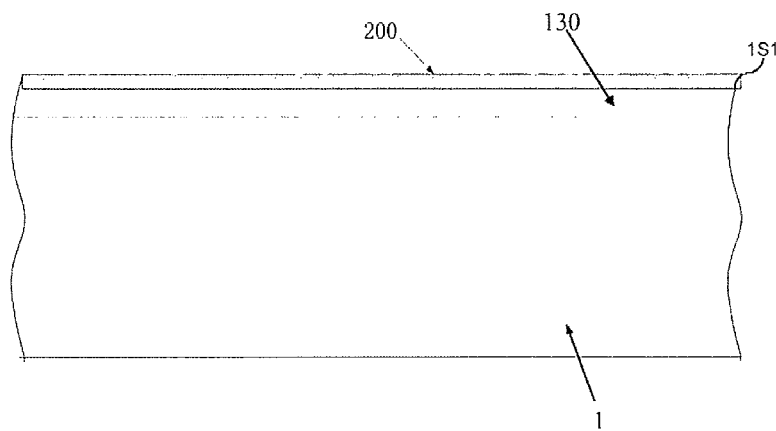
FIGS. 2-12 are longitudinal, sectional views of the IGBT of FIG. 1 in each manufacturing process according to one specific embodiment.

In step two, as shown in FIG. 2, a pre-oxidization layer 200 is formed on the first major surface 1S1 of the N− type semiconductor substrate 1, the thickness of the pre-oxidization layer 200 can be 1000 angstrom to 3000 angstrom.

In step three, as shown in FIG. 2, an N+ layer 130 is formed by performing an N-type impurity implantation on the first major surface of the N− type semiconductor layer 1 after penetrating through the pre-oxidization layer 200. The implantation dose of the N-type impurity can be 2e11~1e13 $cm^{-2}$, the energy thereof can be 60 KEV~120 KEV.

Figure 3:
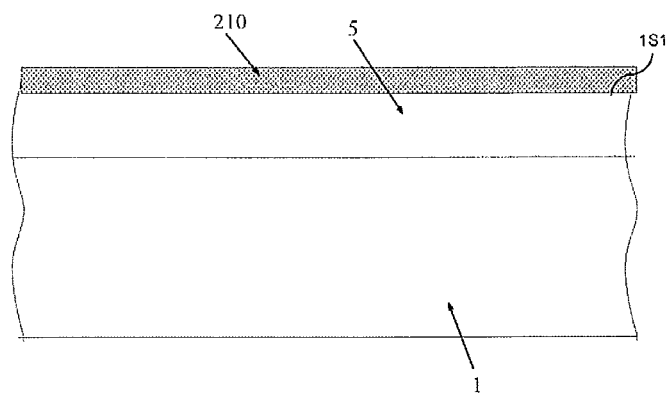

In step four, as shown in FIG. 3, the N+ type semiconductor layer 5 is formed by a high temperature drive-in, a field oxide layer 210 is formed on the pre-oxidization layer 200 subsequently. Specifically, the N+ type semiconductor layer 5 can be formed by drive-in at an aerobic environment under 1100° C. to 1200° C., and a field oxide layer 210 of 6000 angstrom to 20000 angstrom is grown simultaneously. In one preferred embodiment, a square resistance of the formed N+ type semiconductor layer 5 can be 100 ohm/sp to 6000 ohm/sp.

It shows that step two to step four are processes of forming the N+ type semiconductor layer 5.

Figure 4:
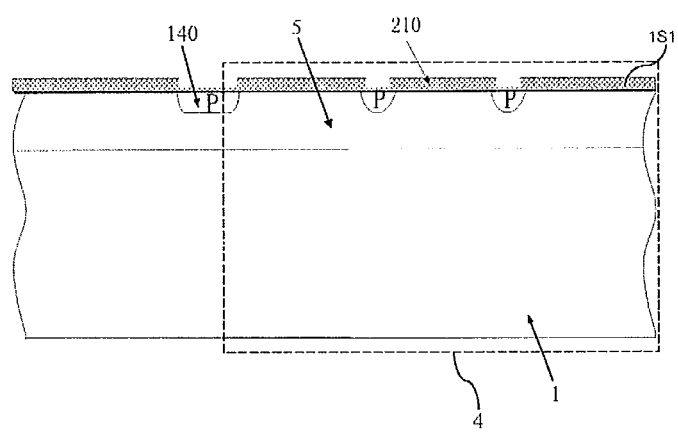

In step five, as shown in FIG. 4, the field oxide layer 210 is selectively etched to form an implantation window for a P-type field limiting ring region 7, and a P-type region 40 is formed by performing a P-type implantation from the etched implantation window to an interior of the N+ type semiconductor layer 5. Specifically, the implantation window for the P-type field limiting ring region 7 is etched on the field oxide layer 210 by adopting a ring photo-mask and performing steps such as gluing, exposure, wet-etching and photo-resist removing, and P-type impurity having a dose of 1e13~1e15 cm$^{-2}$ and an energy of 60 KEV to 120 KEV is implanted from the etched implantation window to the interior of the N+ type semiconductor layer 5, thereby selectively forming the P-type region 140 within the N+ type semiconductor layer 5.

Figure 5:
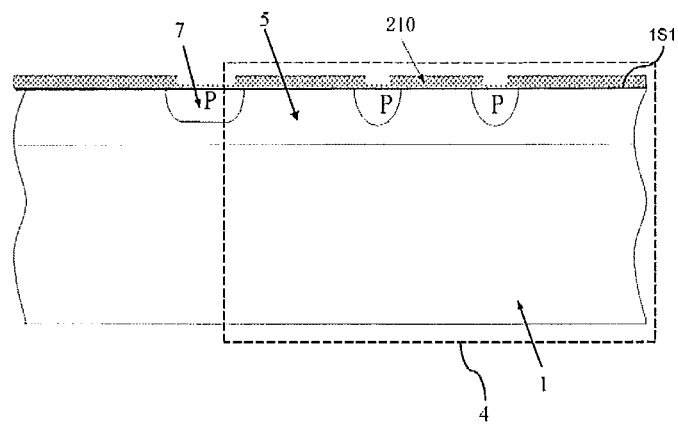

In step six, as shown in FIG. 5, the P-type field limiting ring region 7 is formed by a high temperature drive-in. Specifically, after steps such as rinsing, a drive-in is performed at an aerobic environment under 1100° C. to 1200° C. to form the P-type field limiting ring region 7. In one preferred embodiment, the square resistance of the formed P-type field limiting ring region 7 can be 10 ohm/sp to 1200 ohm/sp.

Figure 6:
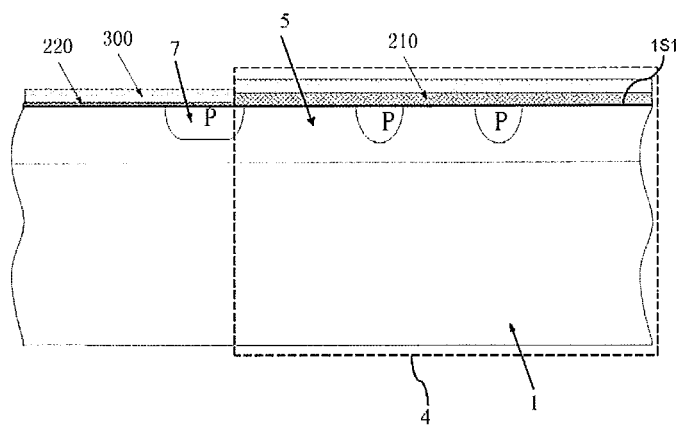

In step seven, as shown in FIG. 6, a gate oxide layer 220 is formed on the first major surface 1S1 of the primitive cell region 2, and a polycrystalline silicon gate electrode 300 is deposited the gate oxide layer 220 and the field oxide layer 210. Specifically, an active photo-mask is adopted, and steps such as gluing, exposure, wet etching and photoresist removing are performed, the gate oxide layer 220 of 800 angstrom to 1200 angstrom is thermally grown on the first major surface 1S1 of the primitive cell region 2. The polycrystalline silicon gate electrode layer 300 is formed by depositing and doping polycrystalline silicon of 6000 angstrom to 12000 angstrom on the gate oxide layer 220 and the field oxide layer 210.

Figure 7:
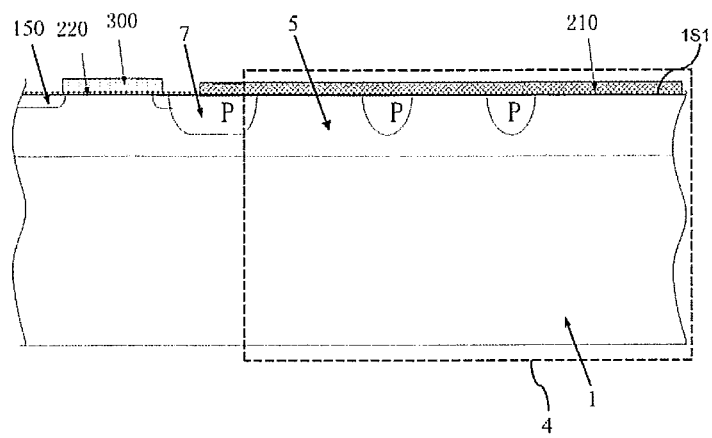

In step eight, as shown in FIG. 7, the polycrystalline silicon gate electrode 300 layer on the top surface of the field oxide layer 210 is removed. The polycrystalline silicon gate electrode layer 300 is selectively etched to form an implantation window for a P-body region 8, and a P-type region 150 is formed by performing a P-type implantation from the etched implantation window to an interior of the N+ type semiconductor layer 5. Specifically, the implantation window for a P-body region 8 is etched on the polycrystalline silicon gate electrode layer 300 by adopting a Poly (polycrystalline silicon) photo-mask and performing steps such as gluing, exposure, wet-etching and photo-resist removing, and P-type impurity having a dose of 1e13 cm$^{-2}$ to 1e15 cm$^{-2}$ and an energy of 60 KEV to 120 KEV is implanted from the window to form the P-type region 150 within the N+ type semiconductor layer 5.

Figure 8:
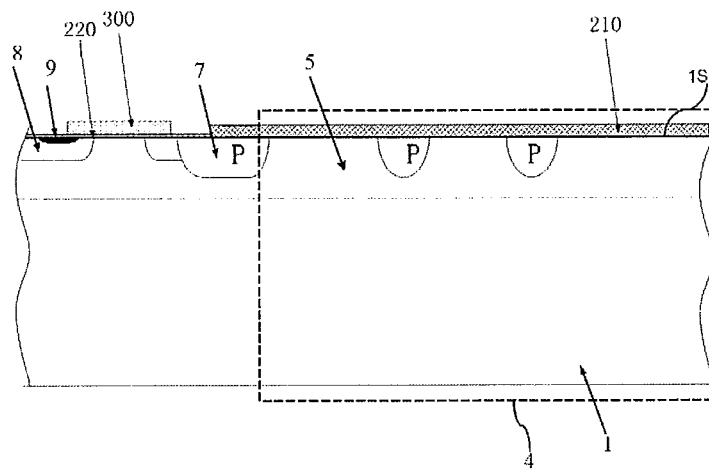

In step nine, as shown in FIG. 8, a P-body region 8 is formed by drive-in under a high temperature, an N+ active region 9 (N+ emitter) is formed by selectively diffusing a high concentration N-type impurity from the surface of the P-body region 8 to an inner of the P-body region 8. Specifically, after steps such as rinsing, the P-body region 8 is formed by drive-in under 1100° C. to 1200° C. N$_2$ (nitrogen) environment, and N-type impurity having a dose of 5e14 to 1e16 cm$^{-2}$ and an energy of 60 KEV to 120 KEV is selectively implanted from the surface of the P-body region 8 to an interior of the P-body region 8, and the N+ active region 9 (N+ emitter) is formed by 800° C. to 1000° C. high temperature annealing activation.

Figure 9:
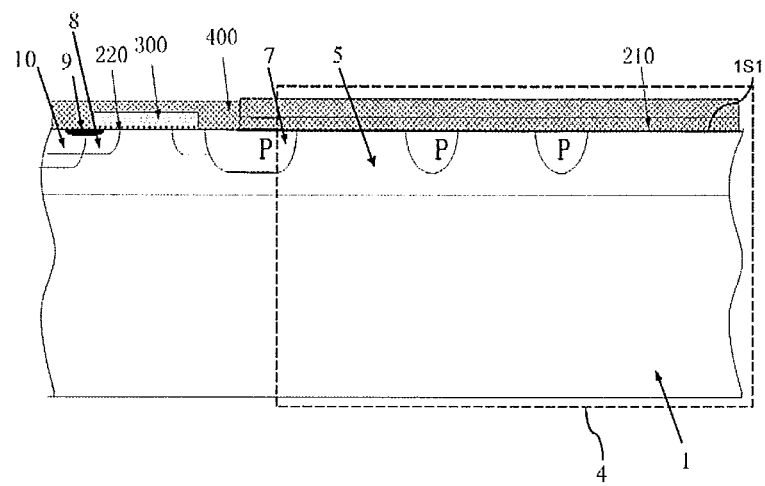

In step ten, as shown in FIG. 9, a P+ active region 10 is formed from the surface of the P-body region 8 within the N+ active region 9 to an interior of the P-body region 8, and a dielectric layer 400 is formed on the first major surface 1S1 of the N+ type semiconductor layer 5. Specifically, an oxide layer is deposited, a Spacer etching and a silicon etching are performed to the entire device successively, a boron implantation is performed and the P+ active region 10 is formed, a BPSG (boro-phospho-silicate-glass) of 8000 angstrom to 16000 angstrom is deposited, and a dielectric layer 400 is formed after a backflow under 850° C. to 950° C.

Figure 10:
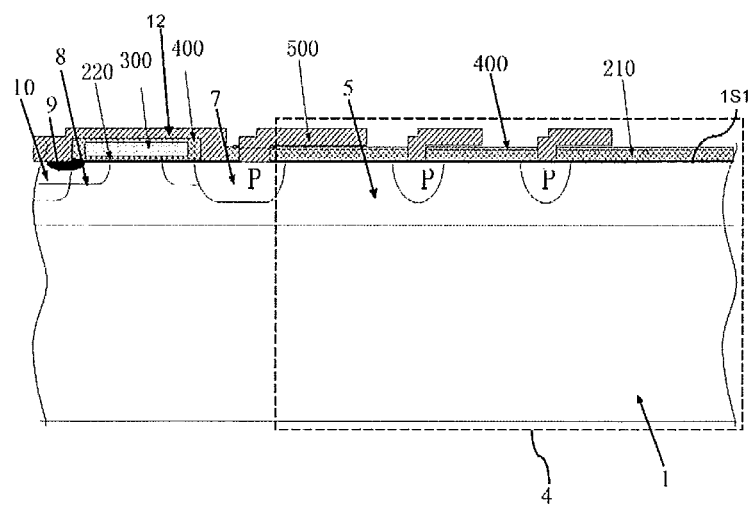

In step eleven, as shown in FIG. 10, a contact hole shortly connecting the N+ active region 9 and the P+ active region 10 is etched on the primitive cell region 2 by photo-etching and etching process, and a contact hole connecting the P-type field limiting ring region 7 is etched on the terminal protection region 4; a metal layer covering the dielectric layer 400 is formed on the first major surface of the N+ type semiconductor layer 5. Adopting a photo-etching and etching process to selectively remove a portion of the metal layer to form an emitter 12 on the primitive cell region 2, the emitter 12 covers the dielectric layer 400 and electrically connects with the N+ active region 9 and the P+ active region 10, while a metal field plate 500 covering a part of the dielectric layer 400 and electrically connecting with the P-type field limiting ring region 7 is formed on the terminal protection region 4. Specifically, a Cont (contacting hole) photo-mask is adopted, and a hole etching and a metal sputtering are preformed successively, the metal layer is etched by adopting a metal photo-mask, thereby forming the metal emitter 12 and the metal field plate 500.

It shows that step five to step eleven are processes for forming the protection terminal, the IGBT unit and the emitter 12.

Figure 11:
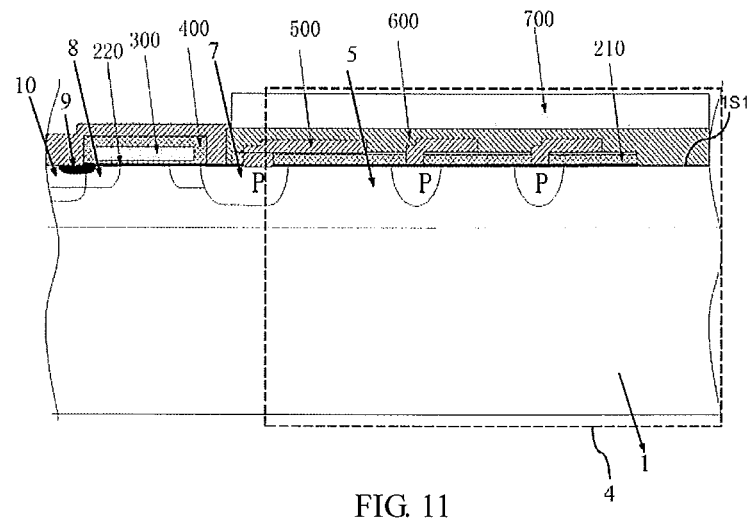

In step twelve, as shown in FIG. 11, a passivation layer 600 and a passivation layer 700 are formed on the emitter 12 and the metal field plate 500 successively, and a PAD (bonding pad) region (not shown) for leading out the gate electrode 300 and the emitter 12 is reserved. Specifically, a PAD 1 (bonding pad 1) photo-mask and a PAD 2 (bonding pad 2) photo-mask are adopted, the passivation layer 600 and the passivation layer 700 are formed by performing steps such as gluing, exposure, photo-resist removing and annealing curing under 380° C. to 450° C., successively. Other steps can also be adopted to specifically perform step twelve, for example, the first passivation layer 600 and the second passivation layer 700 for protecting the chip surface from being contaminated by external ions are successively deposited on the emitter 12 and the metal field plate 500 by adopting chemical vapor deposition, and the PAD (bonding pad) region for leading out the gate electrode 300 and the emitter 12 is formed by photo-etching and etching technology. In a preferred embodiment, a photosensitive Polyimide having a thickness of 4 µm to 8 µm serves as the passivation layer of the device.

Figure 12:
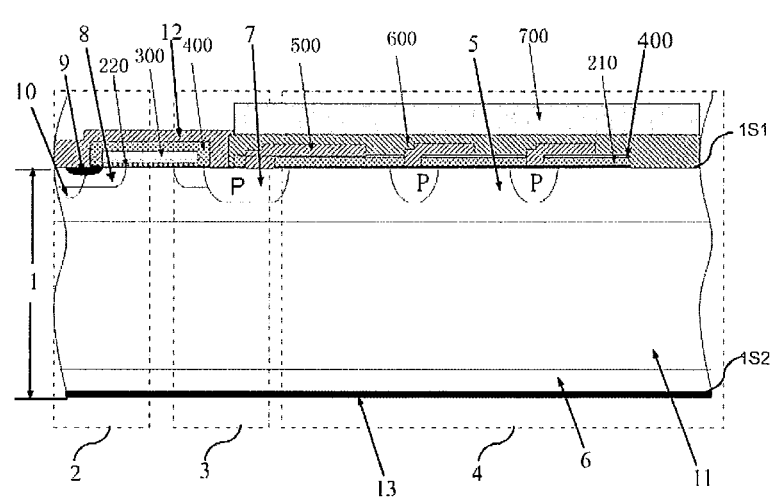

In step thirteen, as shown in FIG. 12, a thickness of the N− type semiconductor substrate 1 is reduced by a backside grinding technology, and a P+ collector 6 is formed on the second major surface 1S2 of the ground N− type semiconductor 1, and then a metal layer 13 (such as Al—Ti—Ni—Ag) with a certain thickness is formed on the P+ collector 6, the metal layer serves as the second main electrode (it is a collector, in the embodiment). Specifically, the N− type semiconductor substrate 1 can be grinded to a required thickness by backside grinding, and P-type impurity having a dose of 5e12 cm$^{-2}$ to 1e15 cm$^{-2}$ and an energy of 60 KEV to 120 KEV is implanted from the second surface 1S2 of the ground N− type semiconductor substrate 1, and the P+ collector 6 is formed by annealing activation, and then a backside metallization is preformed to form the collector 13.

Therefore, the NPT-IGBT as shown in FIG. 1 can be manufactured. For one skilled in the art, various mortification and alternative can be made to the invention, according to the spirit of above described manufacturing method. For example, in a modified embodiment, the high temperature drive-in in step three and the high temperature drive-in in step five can be combined into one high temperature drive-in process in step five. Step five to step eleven are processes for forming the IGBT unit, the protection terminal, and the emitter 12 on the first major surface 1S1 of the N+ type semiconductor layer 5, if the IGBT is MOSFET of other types, or the protection terminal is other protection terminal structure such as P-type field limiting ring, then the manufacturing steps should be changed accordingly.

In the manufacturing method of the IGBT of the invention, one ions implantation is added before manufacturing the IGBT unit and the protection terminal, to form the first semiconductor layer 5 with the first conductivity type on the first major surface 1S1 on the semiconductor substrate 1 with the first conductivity type, and a doping concentration of the first semiconductor 5 is greater than a doping concentration of the semiconductor substrate 1, therefore, the first semiconductor layer 5 functions as a carrier storage layer in the primitive cell region 3, thereby reducing a forward conductive voltage drop of the IGBT according to the invention, and simultaneously a concentration of the impurity on the surface of the protection terminal is increased, an influence to the surface electric field of the protection terminal caused by the mobile charges is reduced, therefore, a voltage withstanding reliability of the device is enhanced. Comparing to the conventional manufacturing method, the method can obtain a carrier storage structure without adding a photo-mask, it has advantages of low cost and accuracy control.

In above embodiments, N-type is taken as the first conductivity type and P-type is taken as the second conductivity type, in other modified embodiments, P-type can be taken as the first conductivity type and N-type can be taken as the second conductivity type. Then, the P– type semiconductor substrate 1 is adopted, and the first semiconductor layer 5 is a P+ semiconductor layer, the IGBT is a P-channel MOSFET unit, the second main electrode 13 is the emitter, the first main electrode 12 is a collector. The specific structure and principle of the P-channel MOSFET is similar to that of the aforementioned IGBT, which will not specifically described hereinafter.

In above embodiments, the NPT-IGBT is illustrated; the invention can also be applied to a field-stop IGBT.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing an IGBT, comprising the following steps:
    (a) manufacturing a semiconductor substrate with a first conductivity type and having a first major surface and a second major surface, which comprises a primitive cell region and a terminal protection region located outside the primitive cell region;
    (b) forming a first semiconductor layer with the first conductivity type on the first major surface of the semiconductor substrate, wherein a doping concentration of the first semiconductor layer is greater than a doping concentration of the semiconductor substrate, wherein the first conductivity type is N-type, the semiconductor substrate with the first conductivity type is an N– type semiconductor substrate, and the first semiconductor layer is N+ type semiconductor layer, wherein the forming the N+ type semiconductor layer comprises:
        (i) forming a pre-oxidization layer on the first major surface of the N– type semiconductor substrate;
        (ii) forming an N+ layer by performing an N-type impurity implantation on the first major surface of the N– type semiconductor substrate after penetrating through the pre-oxidization layer; and
        (iii) forming a field oxide layer from the pre-oxidation layer, and the N+ type semiconductor layer by a high temperature drive-in in an aerobic environment; and
    (c) forming an IGBT unit on a first major surface of the first semiconductor layer within the primitive cell region, wherein the IGBT unit forms a channel with the first conductivity type when the IGBT unit is conducting.

2. The method of manufacturing the IGBT according to claim 1, further comprising:
    forming a protection terminal on the first major surface of the first semiconductor layer within the terminal protection region, wherein forming the protection terminal comprises selectively etching the field oxide layer to form an implantation window.

3. The method of manufacturing the IGBT according to claim 2, further comprising:
    forming a first main electrode on the first major surface of the first semiconductor layer where the IGBT unit is formed;
    grinding the IGBT unit from the second major surface of the semiconductor substrate to form a ground semiconductor substrate;
    forming a second semiconductor layer with the second conductivity type from the second major surface of the ground semiconductor substrate to an interior of the semiconductor substrate; and
    forming a second main electrode in electrical contact with the second semiconductor layer on the second semiconductor layer.

4. The method of manufacturing the IGBT according to claim 3, the second conductivity type is P-type, the IGBT unit is an N-channel MOSFET unit, the second semiconductor layer is P+ type collector layer, the first main electrode is an emitter, and the second main electrode is a collector.

5. The method of manufacturing the IGBT according to claim 1, wherein a thickness of the pre-oxidization layer is 1000 angstrom to 3000 angstrom, an implantation dose of the N-type impurity is 2e11 $cm^{-2}$ to 1e13 $cm^{-2}$, and energy thereof is 60 KEV to 120 KEV.

6. The method of manufacturing the IGBT according to claim 4, wherein the protection terminal comprises a P-type field limiting ring region formed on the first major surface of the first semiconductor layer in the terminal protection region, and a metal field plate positioned above the P-type field limiting ring region and in electrical contact with the P-type field limiting ring region; the N-channel MOSFET unit comprises:
    a P-body region selectively formed from the first major surface of the N+ type semiconductor layer in the primitive cell region to an interior of the N+ type semiconductor layer;
    an N+ active region selectively formed from the P-body region to an interior of the P-body region;
    a P+ active region selectively formed from a surface of the P-body region in the N+ active region to an interior of the P-body region;

a gate oxide layer formed on a first major surface of a margin portion of the P-body region and the first major surface of N+ type semiconductor layer in the primitive cell region where the P-body region does not form;

a polycrystalline silicon gate electrode formed on an upper surface of the gate oxide layer; and a dielectric layer covering the gate oxide layer and an exposing surface of the polycrystalline silicon gate electrode;

wherein the first main electrode is formed outside the dielectric layer and electrically connects to the N+ active region and the P+ active region.

7. The method of manufacturing the IGBT according to claim 1, wherein the field oxide layer has a thickness in the range from 6000 to 20,000 angstroms.

* * * * *